(12) United States Patent
Smart et al.

(10) Patent No.: US 6,340,806 B1
(45) Date of Patent: Jan. 22, 2002

(54) ENERGY-EFFICIENT METHOD AND SYSTEM FOR PROCESSING TARGET MATERIAL USING AN AMPLIFIED, WAVELENGTH-SHIFTED PULSE TRAIN

(75) Inventors: Donald V. Smart, Boston, MA (US); Donald J. Svetkoff, Ann Arbor, MI (US)

(73) Assignee: General Scanning Inc., Wilmington, MA (US)

( * ) Notice: Subject to any disclaimer, the term of this patent is extended or adjusted under 35 U.S.C. 154(b) by 0 days.

(21) Appl. No.: 09/585,693

(22) Filed: Jun. 1, 2000

Related U.S. Application Data

(63) Continuation-in-part of application No. 09/473,926, filed on Dec. 28, 1999, now Pat. No. 6,281,471.

(51) Int. Cl.$^7$ .......................... B23K 26/00; B23K 26/36
(52) U.S. Cl. .................................. 219/121.62
(58) Field of Search .................. 219/121.6, 121.61, 219/121.62, 121.67, 121.68, 121.69, 121.7, 121.71, 121.72

(56) References Cited

U.S. PATENT DOCUMENTS

| | | | |
|---|---|---|---|
| 6,208,458 B1 * | 3/2001 | Galvanauskas et al. | 359/345 |
| 6,281,471 B1 * | 8/2001 | Smart | 219/121.62 |

\* cited by examiner

*Primary Examiner*—Samuel M. Heinrich

(74) *Attorney, Agent, or Firm*—Brooks & Kushman P.C.

(57) ABSTRACT

An energy-efficient method and system for processing target material such as microstructures in a microscopic region without causing undesirable changes in electrical and/or physical characteristics of material surrounding the target material is provided. The system includes a controller for generating a processing control signal and a signal generator for generating a modulated drive waveform based on the processing control signal. The waveform has a subnanosecond rise time. The system also includes a gain-switched, pulsed semiconductor seed laser having a first wavelength for generating a laser pulse train at a repetition rate. The drive waveform pumps the laser so that each pulse of the pulse train has a predetermined shape. Further, the system includes a fiber amplifier subsystem for optically amplifying the pulse train to obtain an amplified pulse train without significantly changing the predetermined shape of the pulses. The amplified pulses have little distortion and have substantially the same relative temporal power distribution as the original pulse train from the laser. Each of the amplified pulses has a substantially square temporal power density distribution, a sharp rise time, a pulse duration and a fall time. The subsystem also includes a wavelength shifter in the form of an optical fiber for controllably shifting the first wavelength to a second, larger wavelength to obtain an amplified, wavelength-shifted, pulse train. The system further includes a beam delivery and focusing subsystem for delivering and focusing at least a portion of the amplified, wavelength-shifted, pulse train onto the target material. The subsystem may also include a filter coupled to the optical fiber to narrow bandwidth of the amplified, wavelength-shifted, pulse train. The second wavelength may be at the absorption edge of silicon.

84 Claims, 6 Drawing Sheets

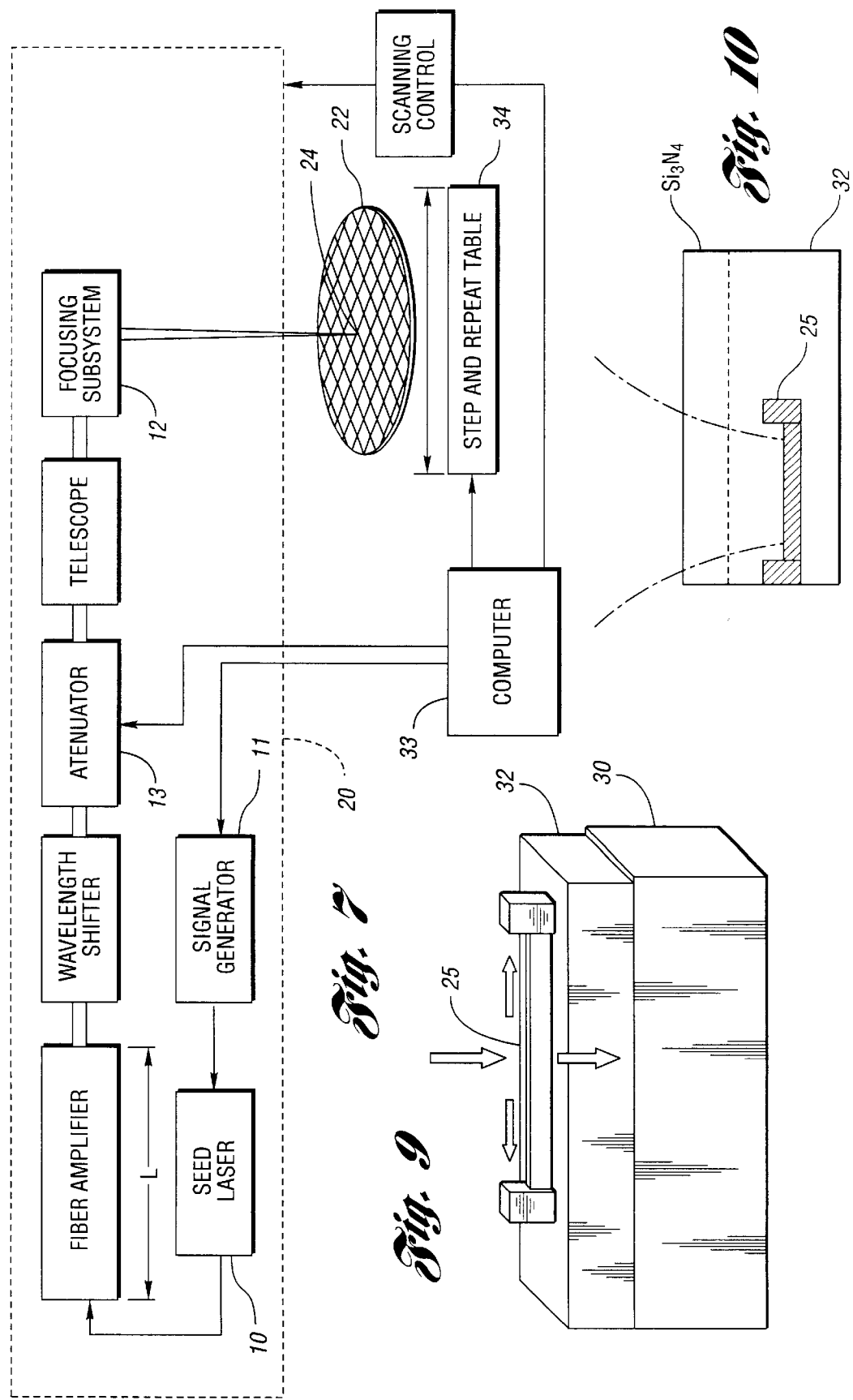

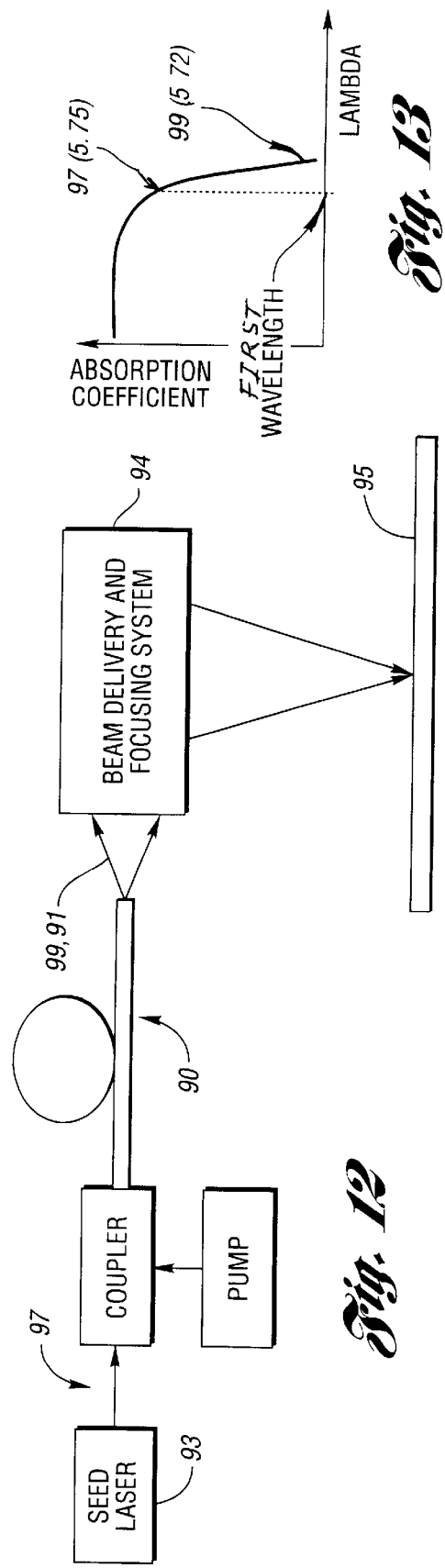
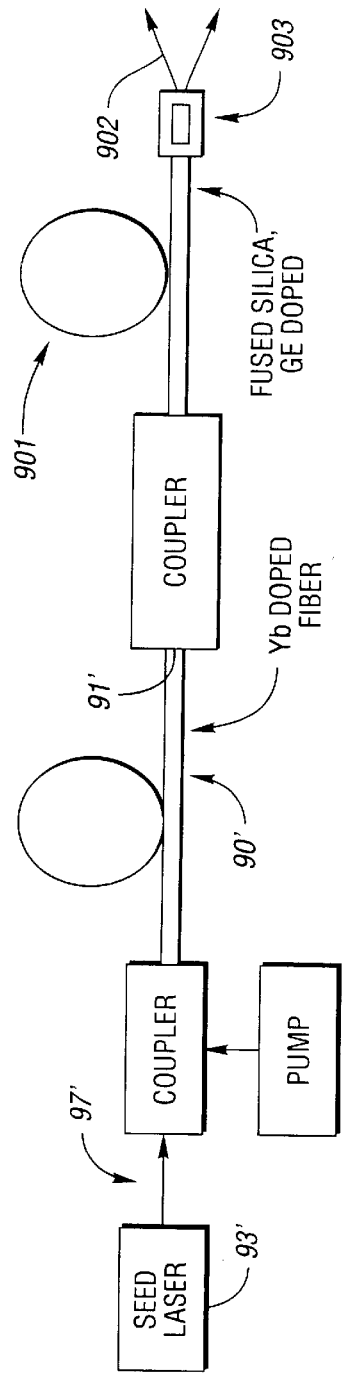
Fig. 12
Fig. 13
Fig. 14

US 6,340,806 B1

ENERGY-EFFICIENT METHOD AND SYSTEM FOR PROCESSING TARGET MATERIAL USING AN AMPLIFIED, WAVELENGTH-SHIFTED PULSE TRAIN

CROSS REFERENCE TO RELATED PATENT AND APPLICATIONS

This application is a continuation-in-part of U.S. patent application Ser. No. 09/473,926, now U.S. Pat. No. 6,281,471, filed Dec. 28, 1999, entitled "Energy-Efficient, Laser-Based Method and System For Processing Target Material". This application is also related to U.S. Pat. No. 6,144,118, filed Sep. 18, 1998, entitled "High Speed Precision Positioning Apparatus". This application is also related to U.S. Pat. No. 5,998,759 (i.e., the '759 patent) entitled "Laser Processing", having the same assignee as the present invention. The entire disclosure of the '759 patent is hereby expressly incorporated by reference.

TECHNICAL FIELD

This invention relates to energy-efficient, laser-based methods and systems for processing target material. In particular, this invention relates to the use of a pulsed laser beam to ablate or otherwise alter a portion of a circuit element on a semiconductor substrate, and is particularly applicable to vaporizing metal, polysilicide and polysilicon links for memory repair. Further application can be found in laser-based micromachining and other repair operations, particularly when it is desired to ablate or modify a microscopic structure without damaging surrounding areas and structures, which often have non-homogeneous optical and thermal properties. Similarly, the material processing operations can be applied to other microscopic semiconductor devices, for instance microelectromechanical machines. Medical applications may also exist, such as microscopic tissue or cell ablation with miniature fiber optic probes.

BACKGROUND OF THE INVENTION

Semiconductor devices such as memories typically have conductive links adhered to a transparent insulator layer such as silicon oxide, which is supported by the main silicon substrate. During laser processing of such semiconductor devices, while the beam is incident on the link or circuit element, some of the energy also reaches the substrate and other structures. Depending upon the power of the beam, length of time of application of the beam, and other operating parameters, the silicon substrate and/or adjacent can be overheated and damaged.

Several prior art references teach the importance of wavelength selection as a critical parameter for substrate damage control. U.S. Pat. Nos. 4,399,345, 5,265,114, 5,473,624, 5,569,398 disclose the benefits of wavelength selection in the range beyond 1.2 um to avoid damaging silicon substrates.

The disclosure of the above-noted '759 patent further elaborates on the wavelength characteristics of silicon. The absorption in silicon rapidly drops off after about one micron with an absorption edge of about 1.12 microns at room temperature. At wavelengths greater than 1.12 microns, the silicon starts to transmit more and more easily and, thus, it is possible to obtain better part yields upon removing material from the silicon. In the range around 1 micron the absorption coefficient decrease by a factor of four orders of magnitude going from 0.9 microns to 1.2 microns. In going from the standard laser wavelength of 1.047 microns to 1.2 microns the curve shows a drop of two orders of magnitude. This shows a drastic change in absorption for a very slight change in wavelength. Thus, operating the laser at a wavelength beyond the absorption edge of the substrate circumvents damage to the substrate, which is especially important if there is a slight misalignment of the laser beam with respect to the link or where the focused spot extends beyond the link structure. Furthermore, if the substrate temperature rises during processing the absorption curve shifts will shift further into the infrared which can lead to thermal runaway conditions and catastrophic damage.

The problem of liquid crystal repair is similar to the problem of metal link ablation. The wavelength selection principle for maximizing absorption contrast was advantageously applied in the green wavelength region in a manner analogous to the above disclosures for the same purpose—namely removal of metal without substrate damage. The system manufactured by Florod is described in the publication "Xenon Laser Repairs Liquid Crystal Displays", LASERS AND OPTRONICS, pages 39–41, April 1988.

Just as wavelength selection has proven to be advantageous, it has been recognized that other parameters can be adjusted to improve the laser processing window. For example, it was noted in "Computer Simulation of Target Link Explosion in Laser Programmable Redundancy for Silicon Memory" by L. M. Scarfone and J. D. Chlipala, 1986, p. 371, "It is desirable that laser wavelengths and various material thicknesses be selected to enhance the absorption for the link removal process and reduce it elsewhere to prevent damage to the remainder of the structure." The usefulness, in general, of thicker insulative layers underneath links or circuit elements and the usefulness of limiting the duration of heating pulses has also been recognized, as in the paper co-authored by the applicant, "Laser Adjustment of Linear Monolithic Circuits," Litwin and Smart, 100/L.I.A., Vol. 38, ICAELO (1983).

The '759 patent teaches the tradeoffs that exist with selection of the longer wavelengths—specifically compromises with respect to spot size, depth of focus, and pulse width, available from Nd:YAG lasers. These parameters are of critical importance for laser processing at increasingly fine dimensions, and where the chances of collateral damage to surrounding structures exist.

In fact, any improvement which widens the processing window is advantageous as the industry continues to push toward higher density microstructures and the associated geometries which are a fraction of one micron in depth or lateral dimension. The tolerances of energy control and target absorption become large compared to the energy required to process the microstructure at this scale. It should be noted from the above discussion that laser processing parameters are not necessarily independent in micromachining applications where a small laser spot, about 1 μm, is required. For instance, the spot size and pulse width are generally minimized with short wavelengths, say less than 1.2 μm, but the absorption contrast is not maximized. Makers of semiconductor devices typically continue production of earlier developed products while developing and entering production of more advanced versions that typically employ different structures and processes. Many current memory products employ polysilicide or polysilicon links while smaller link structures of metal are used for more advanced products such as the 256-megabit memories. Links of 1 micron width, and ⅓ micron depth, lying upon a thin silicon oxide layer of 0.3 to 0.5 microns are being used in such large memories. Production facilities traditionally have utilized Q-switched diode pumped YAG lasers at and related equipment capable of operating at the conventional wavelengths of 1.047 μm–1.32 μm and related equipment capable of operating in the wavelength region recognized for its lower absorption by silicon. However, these users also recognize the benefits of equipment improvements which results in clean severing of link structures without the risk of later chip failures due to conductive residue or contamination near the ablation site.

Other degrees of freedom include laser pulse energy density (delivered to the target) and pulse duration. It has been taught in the prior art that pulse width should be limited to avoid damage in micromachining applications. For example, in. U.S. Pat. No. 5,059,764 a laser processing workstation is disclosed wherein a q-switched laser system is utilized to produce, among other things, relatively short pulses on the order of 10–50 ns. It was disclosed that for material processing applications (like semiconductor memory repair via link blowing and precision engraving), the output pulse width should be relatively short—and that a pulse width less than 50 ns is required in many applications, for example 30 ns. The proper choice of pulse width allows for ablation (evaporation without melting).

High speed pulsed laser designs may utilize Q-switched, gain switched, or mode-locked operation. The pulse duration and shape of standard Q-switched and other pulsed lasers can be approximated at a fundamental level by integrating the coupled rate equations describing the population inversion and the photon number density relative to the lasing threshold at the start of the pulse. For the Q-switched case, on a normalized scale, a higher number of atoms in the inverted population relative to the threshold the faster the pulse rise time, the narrower the width, and the higher the peak energy. As the ratio decreases the pulse shape becomes broader with lower energy concentration.

Often Q-switched laser pulses resemble a Gaussian temporal distribution, or a mixture of a Gaussian with an exponential decaying tail. As disclosed in the '759 patent, the shorter wavelength diode pumped systems are capable of producing relatively short pulses, about 10 ns, when measured at the half power points (i.e., standard definition of pulse duration) and are operated in a favorable wavelength region. Despite successful operation, applicant has found several limitations associated with the temporal pulse shape characteristic of standard diode pumped Q-switch laser systems, including the practical rise time limitations, the power distribution between the half maximum points, and the pulse decay characteristic which, when improved using the method and system of the present invention, provided noticeably better results in a metal link blowing application.

Throughout the remainder of this specification, "pulse shaping" refers to the generation of a laser pulse which is to be detected with a detector of electromagnetic radiation where "shape" refers to the power on the detector as a function of time. Furthermore, "pulse width" or "pulse duration" refers to the full width at half maximum (FWHM) unless otherwise stated. Also, Q-switched pulses collectively refers to temporal distribution of pulses obtained, for example, in standard Q-switched systems which may resemble a mixture of a substantially Gaussian central lobe with a relatively slow decaying exponential tail. These wave shapes are formally referred to as a "Q-switched pulse envelope" in laser literature. FIG. 1c shows such pulses.

In U.S. Pat. No. 5,208,437 (i.e., the '437 patent), a pulse width specification of less than 1 ns was specified for a memory repair application.

Earlier work by the co-inventors of the '437 patent disclosed in "Laser Cutting of Aluminum Thin Film With No Damage to Under Layers", ANNALS OF THE CIRP, Vol 28/1, 1979, included experimental results with relatively short laser pulses having a "Gaussian" shape as defined above. The results indicated a "desired portion of the interconnection pattern" which is made of aluminum or the like, "can be cut without the layer disposed below the interconnection pattern being damaged".

Specifications for the pulse width of substantially 1 ns or less with energy density of substantially $10^6$ W/cm$^2$ were disclosed for the apparatus. However, there was no disclosure regarding a method of temporal pulse shaping, although spatially the beam was shaped to correspond to the interconnection pattern. Furthermore, applicant's analysis on high density memory devices having multiple layers with specified pulsewidths in the ultrafast range, which is approached with the 100–300 ps used in the '437 patent, have not been satisfactory. Overcoming this limitation would presently require the ultrafast laser system to produce multiple pulses for processing each target site which would slow the laser processing rate to an unacceptable level.

Continuing to the ultrafast scale, experimental results have been disclosed for micromachining operations. The ultrafast pulses have durations on the order of fs (10–15 sec) to ps (10–12) and, at the decreased scale, exploit material properties at the atomic and molecular which are fundamentally different than found in the range of several hundred ps to ns.

In U.S. Pat. No. 5,656,186 and the publication "Ultrashort Laser Pulses tackle precision Machining", LASER FOCUS WORLD, August 1997, pages 101–118, machining operations at several wavelengths were analyzed, and machined feature sizes significantly smaller than the diffraction limited spot size of the focused beam were demonstrated.

Laser systems for ultrafast pulse generation vary in complexity and are exemplary embodiments are described in U.S. Pat. Nos. 5,920,668 and 5,400,350, and in Ultrafast Lasers Escape The Lab", PHOTONICS SPECTRA, July 1998, pp. 157–161. The embodiments generally include methods for pulse stretching of mode locked ultrafast pulses prior to amplification to avoid amplifier saturation followed by compression to extremely narrow widths. This technology holds promise for certain class of micromachining and possibly finer scale "nanomachining" operations, the latter benefit afforded by machining below diffraction limit. However, Applicant has discovered practical limitations at the present time with the available power in each pulse for applications like metal link blowing and similar micromachining applications leading to the unacceptable requirement for multiple pulses.

Applicant wishes to elaborate on the rationale for the use of a short pulse, fast rise time pulse is indicated in the following paragraphs as the reasons are manifold and a number of theoretical and empirical papers and books have been written on the subject. Ablation of metal links is taken as an example, although the principles extend to many laser processing applications where a target material is surrounded by material having substantially different optical and thermal properties. The following references 1–3 are examples:

1. John F. Ready, Effects of High Power Laser Radiation, ACADEMIC PRESS, New York 1971, pages 115–116.
2. Sidney S. Charschan, Guide for Material Processing By Lasers, Laser Institute of America, The Paul M. Harrod Company, Baltimore Md., 1977, pages 5–13.
3. Joseph Bernstein, J. H. Lee, Gang Yang, Tariq A. Dahmas, Analysis of Laser Metal-Cut Energy Process Window (to be published).

Metal Reflectivity

Metal reflectivity decreases with increased power density of a laser pulse (ref. 1). The reflectivity of a metal is directly proportional to the free electron conductivity in a material. At high electric field densities as delivered by a high intensity laser, the collision time between electrons and the lattice is reduced. This shortening of the collision time reduces the conductivity and hence the reflectivity. For example, the reflectivity of aluminum decreases from 92% to less than 25% as the laser power densities increases to the range of $10^9$ watts/cm$^2$. Hence, to circumvent the loss of laser energy to reflection it is advantageous to achieve high power density at the work piece in as short a time as possible.

Thermal Diffusivity

The distance D that heat travels during a laser pulse is proportional to the laser pulse width as follows:

$$D=\sqrt{kt}$$

where:

K is the thermal diffusivity of the material; and t is the length of the laser pulse.

Hence, it can be seen that a short laser pulse prevents heat dissipating to the substrate below the melting link and also heat conducting laterally to the material contiguous to the link. However the pulse must be long enough to heat the link material all the way through.

Thermal Stress and Link Removal

Through the absorption of the laser energy the target metal link heats up and tries to expand. However, the oxide surrounding the link contains the expanding material. Hence, stress is built up within the oxide. At some point the pressure of the expanding metal exceeds the yield point of the oxide and the oxide cracks and the metal link explodes into a fine particle vapor. The principal crack points of metal link occurs at the maximum stress points, which are at the edges of the link both top and bottom as shown in FIG. 1b.

If the oxide over the link is somewhat thin then the cracking of the oxide will occur at the top of the link only and the oxide and link will be removed cleanly as shown in FIG. 1a. However, if the oxide is somewhat thick, cracking can occur at the bottom of the link as well as the top and the crack will propagate down to the substrate as shown in FIG. 1b. This is a highly undesirable circumstance.

Q-switched laser systems can be modified to provide short pulses of various shapes. Typical prior art lasers that produce high peak power, short pulse lasers are standard Q-switched lasers. These lasers produce a temporal pulse having a moderate pulse rise time. It is possible to change this temporal shape by using a Pockets Cell pulse slicer that switch out sections of the laser beam. In U.S. Pat. No. 4,483,005 (i.e., the '005 patent), invented by the Applicant of the present invention and having the same assignee, various methods for affecting (i.e., reducing) laser beam pulse width are disclosed. As taught in the '005 patent, which is hereby incorporated by reference, the laser pulse can be shaped somewhat to produce a "non-Gaussian" shaped beam by truncating energy outside the central lobe. It should be noted that if a relatively broad Q-switched waveform is to be transformed to a narrow, uniform shape, only a small fraction of the pulse energy will be used. For example, truncation of a Gaussian pulse to provide a sharp rise time and a narrow pulse with flatness to within 10% reduces the pulse energy by about 65%.

Similarly, in U.S. Pat. No. 4,114,018 (the '018 patent), temporal pulse shaping to produce square pulses is disclosed. FIG. 7 shows the time interval for relatively flat laser power output. In the '018 patented method, it is necessary to remove a temporal segment of the beam intensity in order to generate the desired pulses.

A desirable improvement over the prior art would provide an efficient method for generating short pulses with high energy enclosure within the pulse duration with rapidly decaying tails. In order to accomplish this, laser technology which produces pulse shapes different than those of the Q-switched pulse envelope is preferred. Such pulses have fast rise time, uniform energy in the central lobe, and fast decay.

The fast rise-time, high power density pulse as produced by a laser other than a standard Q-switched Nd:YAG will best accomplish this task.

These benefits are implemented in a preferred manner in a system which uses laser technology departing significantly from the traditional Q-switched, solid state diode or lamp pumped, YAG technology.

Improvements over the prior art are desired with a method and system for generating pulses having a shape which is different than standard Q-switched pulses—pulses having faster rise time, relatively uniform and higher energy concentration in the central lobe, and fast fall time.

SUMMARY OF THE INVENTION

Applicant has determined that improved results can be obtained in applications of metal link blowing. For instance, a non-Gaussian, substantially rectangular pulse shape is particularly advantageous for metal link processing where an overlying insulator exists. Applicants results show that the fast rise time on the order of 1 ns, and preferably about 0.5 ns, provides a thermal shock to the overlying layer of oxide which facilitates the link blowing process. In addition, at the higher power density the reflectivity is reduced with the fast rising short pulse. A pulse duration of about 5 ns with a substantially uniform pulse shape allows more energy to be coupled to the link leading to a reduced energy requirement for link removal. Rapid fall time of about 2 ns is important to eliminate the possibility of substrate damage. Furthermore, an advantage of a nearly square power density pulse in time is that the power density is the highest when it is needed and the pulse is off when it is not.

A short fast rising pulse will allow the top of the link to melt and expand first before the heat can diffuse down to the lower portion of the link. Hence, stress is built up in the top of the link and promotes cracking of the top layer without generating a crack down to the substrate.

It is an object of this invention to provide a compact, gain switched laser system which has the capability for generating sub-nanosecond rise time pulses having short duration of a few nanoseconds and rapid fall time. State of the art fast pulse systems incorporate gain switched technology, in which a low power semiconductor seed laser is rapidly and directly modulated to produce a controlled pulse shape which is subsequently amplified with a laser amplifier, such as a cladding pumped fiber optic system with a high power laser diode or diode array used as the pump laser. Such laser systems are described in U.S. Pat. No. 5,694,408 and PCT Application No. PCT/US98/42050, and are "building blocks" of certain ultra-fast chirped pulse amplifier systems, for instance the system described in U.S. Pat. No. 5,400,350.

It is a general object of the invention to improve upon prior art laser processing methods and systems, particularly those where the optical and/or thermal properties of a region near the target material differ substantially.

It is a general object of the invention to provide laser pulse shaping capability for micromachining and laser material processing applications, for instance laser ablation of links or other interconnects on semiconductor memories, trimming, drilling, marking, and micromachining. A predetermined waveform shape is generated from a gain-switched laser which is different than that of the standard Q-switched systems.

It is an object of the invention to provide improvements and margin for semiconductor processing, for example, 16–256 megabit semiconductor repair, which results in clean processing of microstructures without the risk of later device failure due to conductive residue or contamination near the ablation site.

It is an object of the invention to provide a pulse waveform rise time in as short as a few hundred picoseconds, the pulse duration typically less than about 10 nanoseconds with rapid pulse decay, thereby providing laser processing of a target structure at high power density, whereby damage arising from thermal shock and diffusion in the surrounding regions is minimized.

It is an object of the invention to prevent damage to the structures surrounding and beneath the target material in semiconductor laser processing applications by achieving high power density at the workpiece in a very short time with a high power, fast rise time pulse at any wavelength suitable for the laser ablation process thereby improving the process window in a semiconductor material processing application.

It is an object of the invention to process a target site with a single laser processing pulse with rise time fast enough and with sufficient power density so as to provide a reduction in the reflectivity of a metal target structure, such a single metal link on a semiconductor memory, and hence provide more efficient coupling of the laser energy. The fast rising laser pulse is of sufficient pulse duration to efficiently heat and vaporize the material of each metallic target structure with relatively uniform power density during the ablation period, yet a rapid pulse fall time after the target material is vaporized avoids damage to surrounding and underlying structures.

It is an object of the invention to provide superior performance in semiconductor metal link blowing applications when compared to systems utilizing standard Q-switched lasers, such lasers having typical pulse rise times of several nanoseconds and represented by a Q-switched pulse envelope. A laser pulse is generated to provide a substantially square pulse shape with pulse duration in the range of about 2–10 nanoseconds and a rise time of about 1 ns and preferably about 0.4 ns. Additionally, the pulse decay is to be rapid when switched off thereby allowing only a very small fraction of pulse energy to remain after the predetermined pulse duration, the pulse "tails" rapidly decaying to a sufficiently low level so as to avoid the possibility of damaging the underlying substrate or other non-target materials. A comparison of these pulses is illustrated in FIG. 2.

It is an object of the invention to expand the processing window of a semiconductor laser ablation process to provide rapid and efficient ablation of microscopic structures surrounded by materials having different optical and thermal properties. Such structures are typically arranged in a manner where the width and spacing between the structures is about 1 micron or smaller and stacked in depth. The application of a short laser pulse cleanly ablates the target material, yet damage to surrounding materials caused by heat dissipation in either the lateral direction or damage to the underlying substrate below the target material is prevented.

It is an object the invention to controllably machine a material having substantially homogeneous optical and thermal properties with the application of a short pulse having high energy density, the pulse duration being a few nanoseconds in the material processing range where a fluence threshold is approximately proportional to the square root of laser pulse width.

In carrying out the above objects and other objects of the present invention, an energy-efficient, laser-based method for processing target material having a specified dimension in a microscopic region without causing undesirable changes in electrical or physical characteristics of material surrounding the target material is provided. The method includes generating a laser pulse train utilizing a laser having a first wavelength at a repetition rate wherein each of the pulses of the pulse train has a predetermined shape. The method then includes optically amplifying the pulse train without significantly changing the predetermined shape of the pulses to obtain an amplified pulse train. Each of the amplified pulses has a substantially square temporal power density distribution, a sharp rise time, a pulse duration and a fall time. The method also includes controllably shifting the first wavelength to a second wavelength different from the first wavelength to obtain an amplified, wavelength-shifted, pulse train. The method further includes delivering and focusing at least a portion of the amplified, wavelength-shifted, pulse train into a spot on the target material wherein the rise time is fast enough to efficiently couple laser energy to the target material, the pulse duration is sufficient to process the target material, the fall time is rapid enough to prevent the undesirable changes to the material surrounding the target material, and the second wavelength more efficiently couples laser energy to the target material than the first wavelength.

The target material may include microstructures such as conductive lines or links, the latter being common circuit elements of redundant semiconductor memories. The conductive lines may be metal lines and wherein the pulse duration is sufficient to effectively heat and vaporize the metal lines, or a specified portion thereof.

The target material may be a part of a semiconductor device such as a semiconductor memory having 16–256 megabits.

The semiconductor device may be a silicon semiconductor device wherein the second wavelength may be at an absorption edge of silicon.

At least a portion of the material surrounding the target material may be a substrate such as a semiconductor substrate.

The target material may be part of a microelectronic device.

The substantially square temporal power density distribution is sufficient to substantially completely ablate the target material.

Preferably, the rise time is less than 1 nanosecond and, even more preferably, is less than 0.5 nanoseconds.

Preferably, the pulse duration is less than 10 nanoseconds and, even more preferably, is less than 5 nanoseconds.

Also, preferably, the fall time is less than 2 nanoseconds.

A single amplified pulse is typically sufficient to process the target material.

The target material may have a reflectivity to the amplified pulses and wherein the power density of the amplified pulses is sufficiently high to reduce the reflectivity of the target material to the amplified pulses and to provide efficient coupling of the laser energy to the target material.

Preferably, each amplified pulse has a relatively uniform power density distribution throughout the pulse duration.

Preferably, each pulse has a temporal power density distribution uniform to within ten percent during the pulse duration.

The material surrounding the target material may have optical properties, including absorption and polarization sensitivity, and thermal diffusivity properties different from the corresponding properties of the target material.

Preferably, the repetition rate is at least 1000 pulses/second and each of the amplified pulses has at least 0.1 and up to 3 microjoules of energy.

Preferably, the step of optically amplifying provides a gain of at least 20 DB.

Also, preferably, both the rise time and the fall time are less than one-half of the pulse duration and wherein peak power of each amplified pulse is substantially constant between the rise and fall times.

Preferably, each of the amplified pulses has a tail and the method also includes attenuating laser energy in the tails of the amplified pulses to reduce fall time of the amplified pulses while substantially maintaining the amount of power of the pulses.

Still further in carrying out the above objects and other objects of the present invention, an energy-efficient system for processing target material having a specified dimension in a microscopic region without causing undesirable changes in electrical or physical characteristics of material surrounding the target material is provided. The system includes a controller for generating a processing control signal and a signal generator for generating a modulated drive waveform based on the processing control signal. The waveform has a sub-nanosecond rise time. The system also includes a gain-switched, pulsed seed laser having a first wavelength for generating a laser pulse train at a repetition rate. The drive waveform pumps the laser so that each pulse of the pulse train has a predetermined shape. Further, the system includes a fiber amplifier subsystem for optically amplifying the pulse train without significantly changing the predetermined shape of the pulses. The subsystem includes a wavelength shifter for controllably shifting the first wavelength to a second wavelength different from the first wavelength to obtain an amplified, wavelength-shifted, pulse train. Each of the amplified pulses has a substantially square temporal power density distribution, a sharp rise time, a pulse duration and a fall time. The system further includes a beam delivery and focusing subsystem for delivering and focusing at least a portion of the amplified, wavelength-shifted, pulse train onto the target material. The rise time is fast enough to efficiently couple laser energy to the target material, the pulse duration is sufficient to process the target material, and the fall time is rapid enough to prevent the undesirable changes to the material surrounding the target material. The second wavelength more efficiently couples laser energy to the target material than the first wavelength.

The fiber amplifier subsystem may further include a filter coupled to the shifter to narrow the bandwidth (decrease the optical wavelength spread) of the amplified, wavelength-shifted, pulse train while providing center wavelength selectivity.

The fiber amplifier subsystem preferably includes an optical fiber and a pump such as a high power laser diode to pump the optical fiber wherein the pump is distinct from the seed laser.

The laser diode pump source may also be gain switched (pulsed and directly modulated) to increase diode lifetime by switching to the "off" state during extended periods where laser processing is not occurring.

Preferably, the seed laser includes a laser diode.

The system may include an attenuator for attenuating laser energy in the tails of the amplified pulses to reduce fall time of the amplified pulses while substantially maintaining the amount of energy of the pulses.

The pulse duration may be chosen as a function of a specified target material dimension. The specified material dimension may be less than the laser wavelength.

A preferred system for aluminum link processing includes a high speed, semiconductor laser wherein the first wavelength is less than about 1.1 $\mu$m and the second wavelength is about 1.1 $\mu$m. Future material advances in semiconductor laser diode technology and fiber materials may provide for operation in the visible region as well as at longer infrared wavelengths.

The seed laser diode may be a multimode diode laser or a single frequency (single mode) laser utilizing a distributed Bragg reflector (DBR), distributed feedback (DFB), or an external cavity design.

The spot size typically has a dimension in the range of about 1 $\mu$m–4 $\mu$m.

The density of the memory may be at least 16–256 megabits.

The semiconductor device may be a microelectromechanical device.

Preferably, the attenuated laser energy in the pulse tail is attenuated by at least 10 dB within 1.5 times the pulse duration.

In a preferred construction of the invention, the gain-switched pulse shape includes a fast rise time pulse, substantially flat at the top, with a fast pulse fall time. A "seed" laser diode is directly modulated to generate a predetermined pulse shape. The optical power is increased through amplification with a fiber laser amplifier to output power levels sufficient for laser processing. The resulting gain-switched pulse at the fiber laser amplifier output is focused onto the target region In a construction of the invention, it can be advantageous to directly modulate the "seed" diode to produce a predetermined gain-switched square pulse and provide low distortion amplification using a fiber laser amplifier to provide output pulse levels sufficient for material processing.

In an alternative construction, the pulse temporal power distribution of the directly modulated seed diode is modified to compensate for distortion or non-uniformity of the fiber amplifier or other components, for instance the "smooth" rise of an output modulator. The resulting laser processing pulse which is focused into the target region will have a desired shape: fast rise time, relatively flat during the pulse duration, with rapid decay.

In a construction of the invention it can be advantageous to enhance the performance of the laser processing system by providing a "pulse slicing" module which is used to attenuate laser energy remaining at the output of the laser processing system when the "seed" laser pulse is terminated, thereby preventing heating of sensitive structures not designated as target material after processing is complete. The "pulse slicing" technique is useful to attenuate the tail of either a modified pulse or a standard Q-switched pulse. This is illustrated in FIGS. 4a and 4b, wherein a log scale is provided in the vertical axis of FIG. 4b.

It is preferred to perform laser processing operations, particularly metal link blowing, at pulse rates of at least 1

KHz (1000 pulses/second) with laser pulse energy of at least 0.1 microjoules in a pulse, the 0.1 microjoules being emitted at the output of the fiber amplifier, where the fiber optic amplifier gain is at least 20 DB(1000:1).

In a construction of the invention, a laser pulse is shaped having a rise and fall time shorter than about one-half of the pulse duration and where the peak power is approximately constant between the rise and fall time.

In a construction of the invention, it is possible to generate a series of closely-spaced, short pulses which, when combined, produce a desired pulse shape as illustrated in FIGS. 3a and 3b.

In a construction of a system using the invention it can also be advantageous to operate the laser at pulse repetition rates exceeding the material processing rate and utilize a computer controlled optical switch to select processing pulses, the computer being operatively connected to a beam positioning system used to position a focused laser beam for material processing.

The above objects and other objects, features, and advantages of the present invention are readily apparent from the following detailed description of the best mode for carrying out the invention when taken in connection with the accompanying drawings.

BRIEF DESCRIPTION OF THE DRAWINGS

FIG. 7 is a block diagram schematic of another laser system of the present invention including a preferred attenuator and an optional shifter;

FIG. 9 shows a perspective diagrammatic view of a link of a memory on its substrate;

FIG. 10 is a drawing of a Gaussian laser beam focused onto a small spot on a focal plane containing a metal link emphasizing the microscopic size of the link compared to the diffraction-limited beam waist;

FIG. 12 is a block diagram schematic view of a system constructed in accordance with the present invention wherein a generated pulse train is wavelength-shifted in a controlled fashion within an optical fiber to impose coupling of laser energy into a target, for example, at the absorption edge of silicon;

FIG. 13 is a graph which shows shifting of the first "unshifted" wavelength to second shifted wavelength at the absorption edge of silicon; and FIG. 14 is a block diagram schematic view of a multiple-stage, fiber amplifier system wherein the input pulse train is wavelength-shifted and amplified to produce an output pulse train.

BEST MODE FOR CARRYING OUT THE INVENTION

Laser Processing System Architecture

Figure 1A:
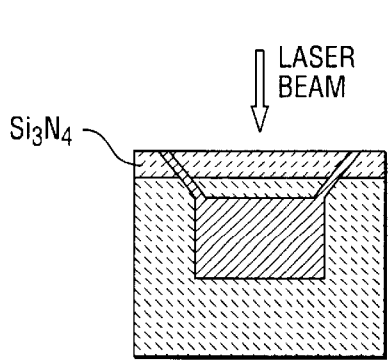
FIG. 1a shows schematically stress cracks in a top surface layer only of a semiconductor caused by expanding vaporized metal.
Figure 1B:
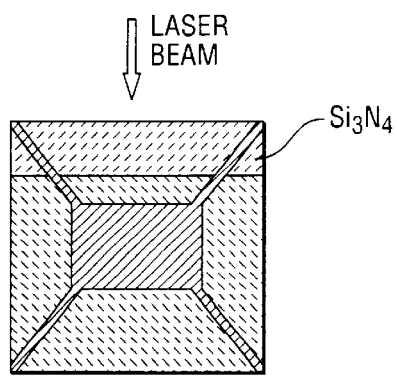
FIG. 1b shows schematically stress cracks in top and bottom layers of a semiconductor caused by expanding vaporized metal.
Figure 1C:
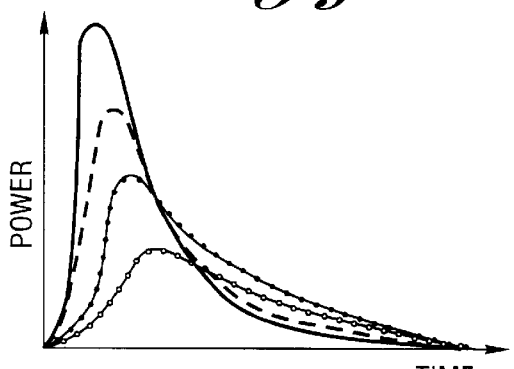
FIG. 1c shows typical prior art laser pulses resembling a Gaussian shape, or a mixture of a Gaussian with an exponential tail, referred to as a "Q-switched pulse envelope"
Figure 2:
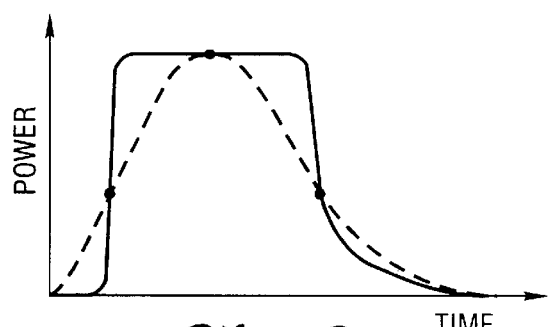
FIG. 2 shows the preferred pulse shape of the present invention for processing metal links when compared to a Q-switched of the same total energy.
Figure 3A:
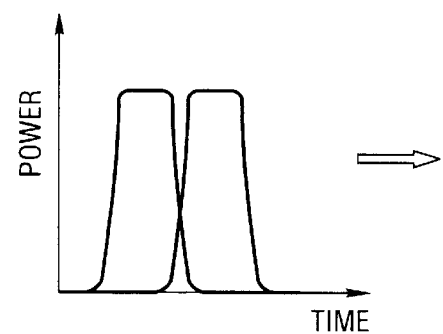
FIGS. 3a and 3b show a method of combining two short pulses closely spaced in time to create a modified pulse.
Figure 3B:
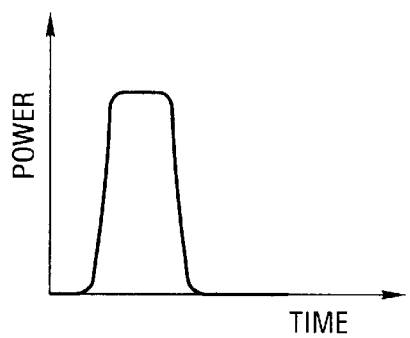
Figure 4A:
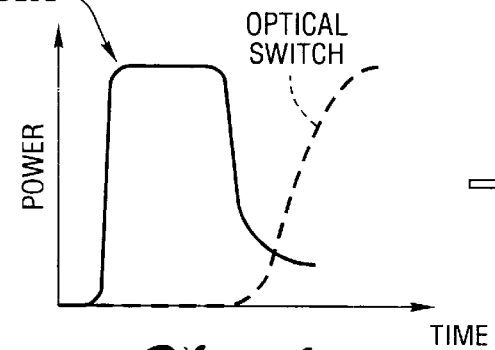
FIGS. 4a and 4b show the result of "pulse slicing" for improving the pulse energy enclosure of a general pulse shape.
Figure 4B:
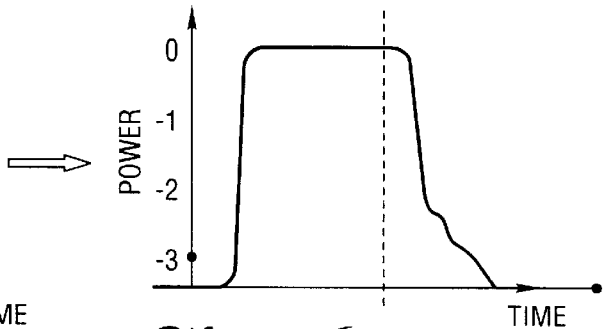

Those skilled in the art can appreciate that the following embodiment can be applied to several applications in micro-machining and laser processing with appropriate adjustments to parameters like laser power, energy density, spot size, wavelength, pulse width, polarization and repetition rate. The specific application to metal link blowing is described for illustrative purposes.

In a preferred embodiment of FIG. 7, a seed laser 10 and a fiber amplifier are mounted on a stable platform attached to the motion system 20 and the workpiece. It is very important in removing links that the beam be positioned with accuracy of less than 3/10 of a micron. The timing of the laser pulse to correlate with the relative positions of the target and optical system is important because of the continuous motion required in order to obtain high processing speeds.

The laser 10 is externally controlled by the computer 33 and a signal generator 11 and transmits its modulated beam to a focusing subsystem 12 comprising high numerical aperture optics and which may further comprise a beam deflector, for instance a galvonometer mirror controlled by a scanner control via the computer 33. The system control computer 33 is also operatively connected to a positioning mechanism or motion system 20 for the system and the signal generator 11 to properly time the pulse generation. The laser beam must be precisely controlled so as to produce a sharply focused beam, with a spot size in the range of about 1.5–4 microns, at the correct location in X, Y and Z. As such, those skilled in the art of beam positioning and focusing will recognize the importance of optics corrected to provide near diffraction and limited performance and precision motion control of the laser head or target substrate. Depending upon the specific laser processing application requirements, it may be advantageous to provide an optical system with a relatively narrow field of view to provide diffraction limited focusing and precision X,Y motion stages for beam positioning. Furthermore, various combinations of mirror motion for rapid deflection in combination with translation stages are viable.

A step and repeat table 34 can also be used to move a wafer 22 into position to treat each memory die 24 thereof. Those skilled in the art of beam scanning will appreciate the advantages of a mirror-based, beam deflection system, but, as noted above, substitution of other position mechanisms such as X,Y translation stages for movement of the substrate and/or laser head are viable alternatives for practicing the invention. For example, the substrate positioning mechanism 34 may comprise very precise (well below 1 micron) X,Y,Z positioning mechanisms operating over a limited range of travel. The positioning mechanism 20 may be used to translate the laser processing optical system components, including the laser, fiber amplifier, and focusing subsystem in a coarser fashion. Further details on a preferred positioning system are disclosed in the above-noted pending U.S. patent application entitled "High Speed Precision Positioning Apparatus", Ser. No. 09/156,895, filed Sep. 18, 1998.

A system optical switch 13 in the form of a further acousto-optic attenuator or pockels cell is positioned beyond the laser cavity, in the laser output beam. Under control of the computer 33, it serves both to prevent the beam from reaching the focusing system except when desired, and, when the processing beam is required, to controllably reduce the power of the laser beam to the desired power level. During vaporization procedures this power level may be as little as 10 percent of the gross laser output, depending upon operating parameters of the system and process. The power level may be about 0.1 percent of the gross laser output during alignment procedures in which the laser output beam is aligned with the target structure prior to a vaporization procedure. The acousto-optic device is generally preferred because of the ease of use, although the delay of the pockels cell is considerably less.

In operation, the positions of the wafer 22 (or target or substrate) are controlled by the computer 33. Typically, the relative movement is at substantially constant speed over the memory device 24 on the silicon wafer 22, but step and repeat motion of the wafer is possible. The laser 10 is controlled by timing signals based on the timing signals that control the motion system. The laser 10 typically operates at a constant repetition rate and is synchronized to the positioning system by the system optical switch 13.

In the system block diagram of FIG. 7, the laser beam is shown focused upon the wafer 22. In the magnified view of FIG. 9, the laser beam is seen being focused on a link element 25 of a memory circuit or device 24.

For processing fine link structures, spot size requirements are becoming increasingly demanding. The spot size requirement is typically 1.5–4 microns in diameter, with peak power occurring in the center of the spot with good conformance to a Gaussian distribution, and with lower power occurring at the edges. Excellent beam quality is needed, approaching diffraction limit, with a beam quality or "m-squared factor" of about 1.1 times or better typical. This "times diffraction limit" quality standard is well known to those skilled in the art of laser beam analysis. Low sidelobes are also preferred to avoid optical crosstalk and the undesirable illumination of features outside the target region.

The link 25 is somewhat smaller than the spot size, thereby mandating precision positioning and good spot quality. A link may be, for instance, 1 micron wide and about ⅓ micron thick. In the case demonstrated here, the link is made of metal, and a lateral dimension (width) and thickness are smaller than the laser wavelength.

Laser System—Preferred

Figure 5:
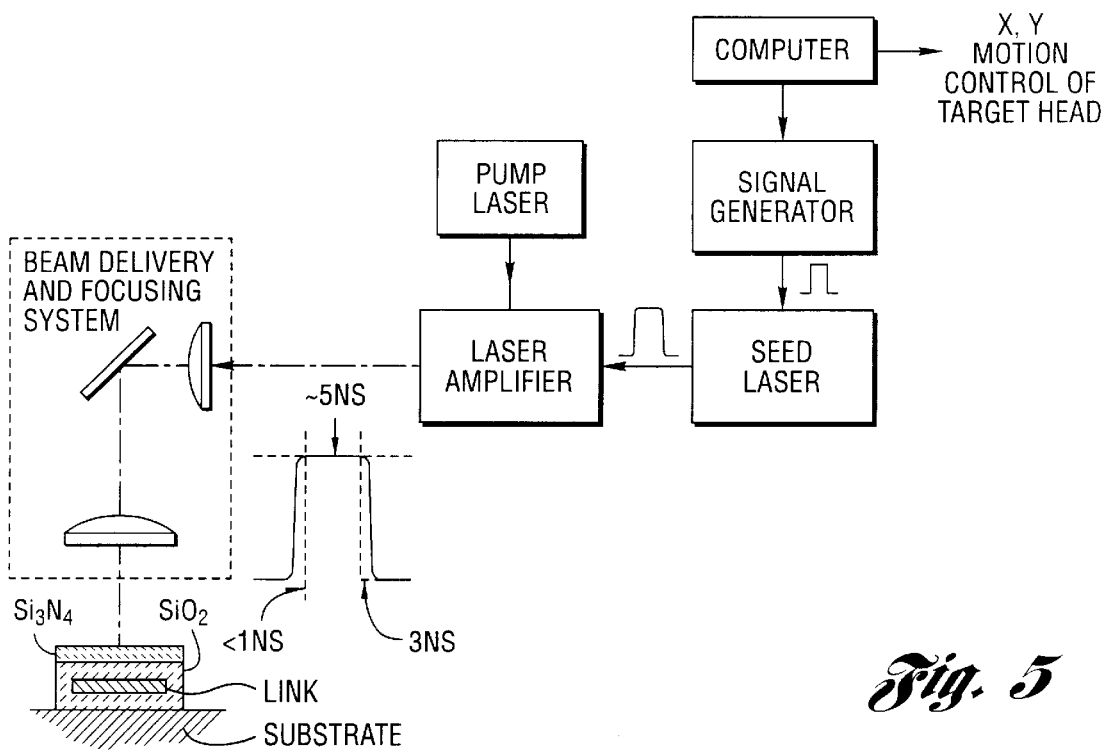
FIG. 5 is a general block diagram of a preferred laser system for laser material processing.

In a preferred embodiment a laser subsystem of FIG. 5 utilizes a master oscillator, power amplifier (MOPA) configuration. This system produces a laser pulse that seeds an amplifier to produce a high power short rise time pulse. A seed laser is the key to producing the fast rise time, short pulse but at very low energy levels. The system requires a laser amplifier to produce enough energy to do material processing. A fiber laser amplifier and a high-speed infrared laser diode having an output wavelength suitable for a laser processing application is preferred. With such a system a laser can be devised that produces a laser pulse of the preferred shape and speed as shown in the lower part of FIG. 5. That is, a fast rise time pulse, square at the top and a fast fall time. This pulse shape, in turn, provides the desired laser-material interaction results of reduction in metal reflectivity, low diffusion of the energy into the device and cracking of the top oxide without damage to the lower oxide.

The MOPA configuration is relatively new and pulsed versions are regarded as state of the art. The laser diode which has sub-nanosecond rise time in response to a modulating drive waveform is a starting point in the fiber laser MOPA configuration, with the laser diode as a gain element. The laser diode generally has multiple longitudinal modes and the sub-system can be configured for single mode operation or otherwise tuned with bulk components at the output or, alternatively, with integrated fiber gratings in the system.

Figure 6A:
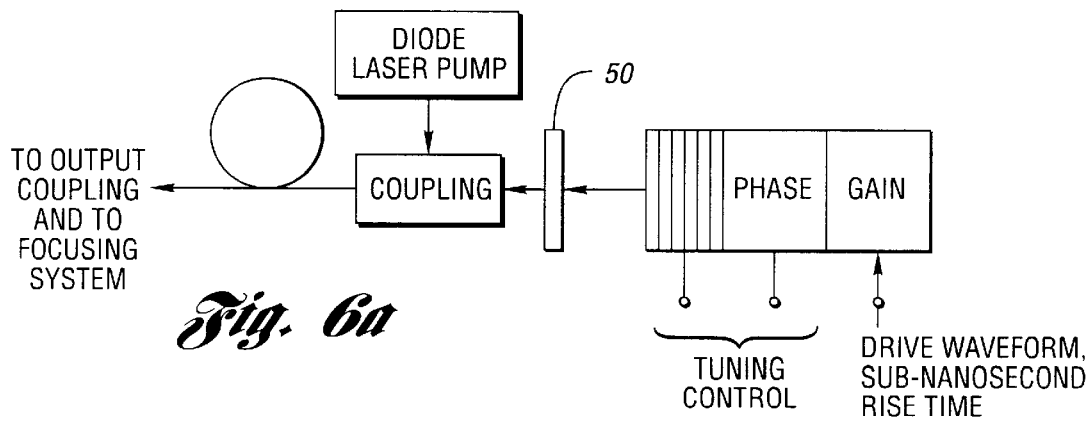
FIG. 6a is a schematic diagram of one type of a MOPA laser system with a distributed Bragg laser as the semiconductor seed laser; this is a single mode laser and a fiber optic amplifier producing the preferred pulse shape.
Figure 6B:
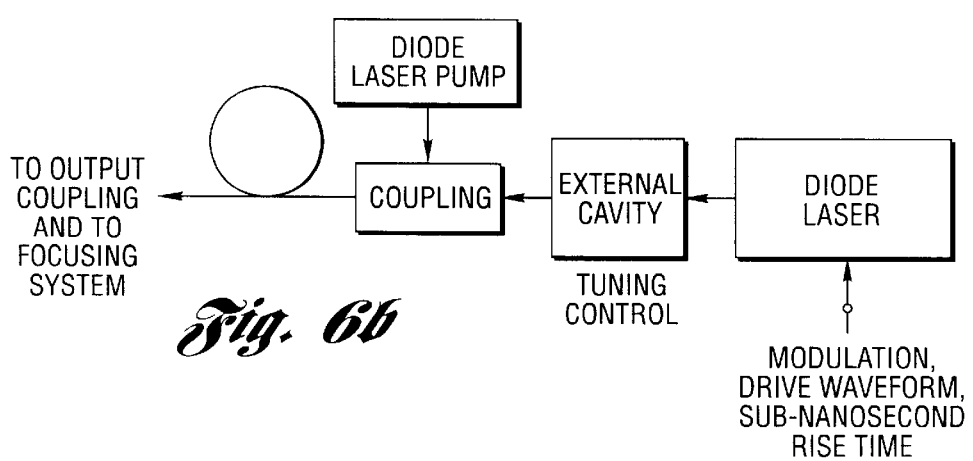
FIG. 6b is a schematic diagram of a single frequency laser with external cavity tuning and a fiber optic amplifier.
Figure 8:
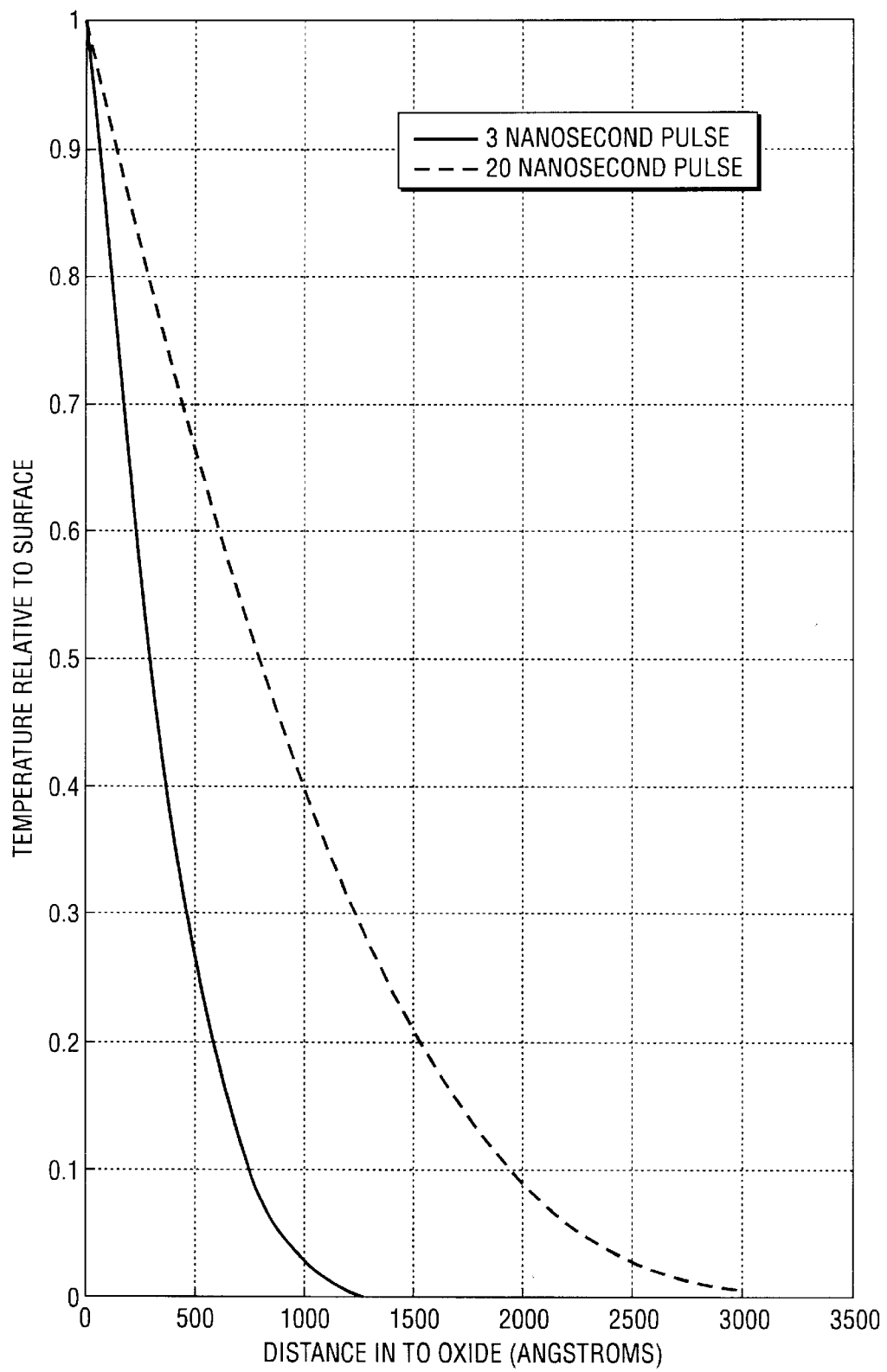
FIG. 8 is a graph of temperature at the interface between the silicon dioxide layer and the silicon substrate in FIG. 9, as a function of the thickness of the silicon dioxide layer.

For instance, the Littman-Metcalf grating configuration described in product literature by New Focus Inc., in the external cavity configuration, is a viable configuration. FIG. 6b shows a schematic of a single frequency laser with external cavity tuning and also includes an optical fiber pumped at its cladding by diode laser pump.

Other diode laser alternatives include distributed feedback lasers (DFB) and distributed Bragg lasers (DBL) which have integrated gratings and waveguide structures, some cases with external controls allowing the user to independently control the gain, phase, and grating filter. See FIG. 6a for a DBL configuration including a coupler 50. This provides flexible mode selection and tuning capability. The laser frequencies can be dynamically selected with a number of the configurations by adjustments of the bulk components, such as the grating and/or mirrors of the external cavity, or, alternatively, a fixed wavelength or mode chosen. The range over which the diode central wavelength can be selected is impressive overall, from less than 1 $\mu$m to about 1.3–1.5 $\mu$m or longer, the latter wavelengths corresponding to those used for fiber optic communication.

In any case, a key element for the purpose of this invention, at a laser wavelength selected for material processing, is the rise time of the "seed" laser diode and the pulse shape. Also, a consideration for this invention is that the seed laser wavelength be matched to the spectral band over which the fiber optic amplifier has high gain with little sensitivity to small wavelength changes—i.e., in the amplifier "flat" response region for maintaining excellent pulse-to-pulse power output with sufficient power. For Ytterbium-doped fibers, the gain is high in about a reasonably broad wavelength band near the 1.1 $\mu$m absorption edge of silicon. Further development in materials or integrated fiber components may extend the useful wavelength regions providing more flexibility in matching the fiber emission spectrum, the seed laser wavelength and target material properties. For example, in *Photonics Spectra,* August 1997, p. 92, the results are reported for a state-of-the-art fiber laser development over a wavelength range of 1.1 $\mu$m to 1.7 $\mu$m.

The operation of a Raman shifter was described in the above-noted '759 patent with the specific use with a short pulse Q-switched system. If desired this device could also be placed at the output of the fiber system to shift the output wavelength to a desirable region to improve absorption contrast, for example. Recognizing the importance of pulse width and small spot size requirements for processing, as taught in the above-noted '759 patent, typical operation of the preferred system for metal link processing will be in the range of about 1.06 $\mu$m or beyond, with a 1.08 $\mu$m wavelength, for example.

The output of the seed laser is to be amplified for laser material processing. The preferred fiber optic laser amplifier will provide gain of about 30 db. The seed laser output is coupled to the core of the fiber laser either directly or with bulk optics which splits the beam for fiber delivery. Both techniques are routinely practiced by those skilled in the art of ultrafast lasers using chirped pulse amplification, but the system of the preferred embodiment is overall much less complex than such ultrafast systems. In the system of the present invention, the seed pulse is amplified and no optics for pulse stretching and compression are required. The fiber used in the amplifier system is cladding pumped with a diode laser having a substantially different wavelength than the seed laser, for example 980 nm, which allows for optical isolation of the seed and pumping beams with a dichroic mirror in the bulk optical system arrangement. From the standpoint of cost, size, and ease of alignment, the preferred arrangement utilizes a coupling arrangement where the seed laser is directly coupled to the fiber amplifier. The pump laser injects the high power diode energy, say at 980 nm wavelength, into the cladding structure of a rare earth Ytterbium (Yb)-doped fiber using coupling techniques familiar to those skilled in the art of fiber laser system design.

Low distortion is an important characteristic of the fiber amplifier. Low distortion allows the output pulse shape to substantially match the seed laser pulse shape or possibly further enhance the pulse edges or uniform power shape. The fiber optic gain medium produces the amplifier pulse of FIG. 5 which is delivered to the optical system and focused onto the object.

Multiple fiber amplifiers can be cascaded for further gain if desired, provided the distortion is low. It could be advantageous to provide active optical switches or passive optical isolators at the output of intermediate stages to suppress spontaneous emission. These techniques are known by those skilled in the art and are disclosed in U.S. Pat. No. 5,400,350 and International Publication WO 98/42050, for example.

In some cases it may be desirable to further improve the pulse shape by reducing the "tails" with a pulse slicer added to the laser sub-system. This may be in the form of an electro optic device such as a pockels cell or preferably a low delay acousto-optic modulator. This technique can suppress energy in the pulse tails to negligible levels whenever the risk of damage occurs at a small multiple of the "pulse duration" of the processing pulse. For example, if the energy is reduced by 20 dB (100:1) within 1.5 times the predetermined pulse duration, there will be for all practical purposes no risk of substrate damage in metal link blowing applications. To be more specific, if a pulse duration of 8 ns is chosen for a square pulse shape in a metal link blowing application and the energy is 20 dB down at 12 ns, the remaining energy is far below that which would cause damage to the Si substrate, this damage being substantial at about 18 ns or more after application of the laser pulse. In a preferred mode of operation, the low delay, high bandwidth pulse slicer will be activated near the end of the amplifier pulse duration and will have a multiplicative effect on the pulse tail, with minimal distortion of the central lobe. Any effects of the amplifier distortion and the "turn on delay" of the modulator can be compensated to some degree by changing the shape of the seed diode laser waveform during the pulse duration. The resulting temporal pulse shape in the focused beam is compensated and is of the desired square shape.

Also, presently fiber systems operate optimally at pulse repetition rates of about 20 KHz which is somewhat faster than the processing rate. An output optical switch, for example a low delay acousto-optic modulator, with its driver operatively connected to a computer, select pulses for processing. In this way the reliability of the fiber amplifier and hence the processing system is high. Those skilled in the art will recognize that it would be advantageous from an economical standpoint to combine the pulse slicer and output optical switch into a single module.

Alternative—Fiber Amplifier System with Wavelength Shifting

Experiments have shown a tendency of fibers used in the present invention to Raman shift if the power density is high enough. In many applications such a shift is considered undesirable because center wavelength control is diminished and further complications arise from spectral broadening of the fiber laser. In certain applications, for instance coherent communications, narrow spectral width and stability are paramount requirements. For instance, undesirable effects of Raman shifting (and similar Stokes or Brillouin shifts) are disclosed in International Publication WO 98/42050 wherein the diode laser wavelength remains unshifted after amplification in a fiber laser system for material processing.

Raman gain or amplification arises from a third order non-linear interaction of light with a medium. In classical optics a medium is assumed to be linear, and adequately described by a linear system model, with the optical properties independent of the light intensity. However, subsequent to invention of the laser it was determined that high light intensity can produce non-linear behavior in certain medium which can alter the speed, wavelength, or absorption of the light. Furthermore, "photon-photon" interaction or "wave mixing" was discovered where light controls light. The study of $2^{nd}$ and $3^{rd}$ order non-linear optics is an active area of research which has resulted in many practical methods and devices like frequency doubling crystals ($2^{nd}$ order). Following the fundamental discovery of the Kerr effect, other interesting phenomena were observed including self-focusing, self-guiding beams (solitons), and Raman amplification in fibers and crystals results ($3^{rd}$ order). Those skilled in the art of non-linear optics will be generally with the concepts, methods, and analysis of practical devices.

Raman gain arises from self phase modulation within the medium which, after detailed analysis of the non-linearity, leads to a relationship which shows the Raman gain coefficient is proportionally affected as follows:

$$\gamma = \frac{K \cdot P}{n^2 \cdot \lambda \cdot A}$$

Hence the Raman gain G is affected by several parameters. In optical fibers decreasing the a combination of wavelength $\lambda$, cross sectional area A, or index of refraction n increases the gain coefficient $\gamma$ for a given length of fiber. Similarly, increasing the optical power P, within practical limits, also increases the gain. The proportionality K is a parameter of the material. Within limits, the gain G varies exponentially along the length L fiber "cavity":

$$G \alpha \exp(\gamma L)$$

This exponential gain is a general characteristic of optical amplifiers with the introduction of feedback, can produce lasing action. In a construction of the present invention, the lasing action is preferably provided by a gain switched, high-speed, semiconductor seed laser. Further details on Raman gain and third order non-linear optics may be found in the book FUNDAMENTALS OF PHOTONICS, Wiley-Interscience publications, 1991, pp. 751–755.

Various aspects and applications of Raman conversion are discussed in U.S. Pat. Nos. 5,877,097, 5,485,480, 5,473,622 and 5,917,969. Wavelength shifting occurs when a pump beam co-propagating with a signal beam has a wavelength difference equal to the energy difference corresponding to the "Raman Energy" associated with a vibrational states. Silica fibers doped with Germanium are known to have high Raman gain. Similarly, Brillouin shifts correspond to vibrational energy differences, albeit substantially smaller than Raman shifts.

For clarification it is worth noting the differences which may exist between a passive Raman amplifier and the standard Yb doped fiber amplifier, each which may be utilized in various configurations and combinations. It should be recognized that the Raman amplifier does not have an active element within the core. The core is effectively passive although the cladding is pumped as in a standard amplifier or laser. The index of refraction is changed by modifying the Germanium doping of the core. The in turn changes the mode size to increase the Raman shift capability and provide high gain. Hence, the Raman shifting occurs in the Fused Silica medium.

In contrast to the traditional teachings where the output wavelength of the fiber amplifier system used for material processing matches the seed laser wavelength, applicants propose advantageously utilizing the Raman shift within the fiber. An increase in the spectral width (wavelength spread) is tolerated where such an increase is not a significant limiting factor. The wavelength shift is in fact desirable for improving coupling between the laser beam and certain target materials, for instance shifting the wavelength toward the absorption edge of Silicon (about 1.12 $\mu$m), while providing advantages of the present invention, e.g. a pulse with a fast rise time of about 1 ns, a pulse duration of a few nano-seconds, and a rapid fall time.

In the alternative construction of the invention wavelength shifting may be accomplished using Raman amplification within the fiber 90, as shown in FIG. 12. This embodiment results in a compact arrangement wherein a substantially well controlled Raman-shifted output beam 91 is utilized as an advantage, while simultaneously alleviating the condition of uncontrolled shifting.

Referring to FIGS. 12 and 13, in a preferred embodiment of the present invention, Raman shifting, induced by coupling of the light into the vibrational transitions of the medium, is accomplished by either decreasing the core size or changing the index of refraction resulting in enhancement of the Raman process. A laser output 97 has a wavelength $\lambda$ of a seed laser or laser diode 93 which is shifted in the fiber 90 to produce a longer wavelength $\lambda + \Delta\lambda$ output beam 91 at the fiber output. For example, the laser diode 93 may be a semiconductor diode having a center wavelength at about 1.06 $\mu$m, and the Raman shifting may advantageously be used to shift the output to a wavelength 99 of about 1.12 $\mu$m, which is the room temperature absorption edge of Silicon. The output beam 91 is delivered and focused by a system 94 to a silicon device 95.

In a preferred embodiment, the number of amplifier stages are minimized, consistent with the requirements for gain and output power.

In one construction of the invention a two-stage system is utilized as shown in FIG. 14 wherein components which are either the same or similar to the components of FIG. 12 in either construction or function have the same reference numeral but have a single prime designation. A Yb doped amplifier having a fiber 90', having a relatively broad bandwidth and pumped by high power semiconductor diodes, is used as a combination of a pre-amplifier and wavelength shifting stage. The seed laser output wavelength 97', for instance 1.064 $\mu$m produced by a semiconductor laser diode 93', is shifted to a higher wavelength, about 1.120 $\mu$m, for example, to produce a first stage output 91'.

The output 91' is then coupled by a coupler to a passive stage 901 having a relatively narrow bandwidth and high Raman gain, such as a fused silica fiber doped with Germanium forming a Raman amplifier. The amplified output beam 902 diverging from the fiber is then collected and delivered to the target area. A filter 903, which may be a diffraction grating or interference filter, is used to narrow the bandwidth and to reject spurious wavelengths.

By way of example, the table below shows the resulting parameters associated with a special laser fabricated for the applicant for use in the present invention. The peak output energy at the 1.118 $\mu$m transition which is advantageously near the published Silicon absorption edge of 1.12 $\mu$m:

| | |
|---|---|
| Seed Laser Wavelength | 1.064 $\mu$m |
| Output Energy, Rate | 10 uJ at 10 KHz |
| Fiber Length | 3 m |
| Output Wavelength | 1.1176 $\mu$m |
| Spectral Width | 6–9 nm |
| M**2 | 1.05 |
| Pulse Rise Time, Duration, Fall Time | ~1 ns, 5–15 ns, 1 ns |
| Spurious Wavelength Rejection | 22 DB |

The Raman fiber amplifier output beam is then collected and focused by the optical system 94 and focused onto the target region 95. In a construction of the invention the Raman amplifier eliminates the need for the output crystal (e.g. wavelength shifter)—of FIG. 7, without any loss of functionality while simultaneously providing a controlled Raman shift.

Also, standard laser diode wavelengths (e.g. 1.064 $\mu$m) are readily available and when combined with high power diode laser arrays used for pumping (e.g. 980 nm) a useful combination wavelengths can be produced in a preferable range (e.g. about 1.08 $\mu$m to 1.123 $\mu$m, for example) with relatively high output power. Such a combination is advantageous for processing reflective metal link structures (e.g. aluminum) while avoiding damage to collateral structures.

Those skilled in the art will recognize that other combinations of diode laser and pump wavelengths may be advantageous, depending upon the material processing requirements. The principles may be applied at shorter wavelengths, for instance in the red-blue portion of the visible spectrum, where certain materials may require less laser power for adequate processing due to improved coupling efficiency. Also, by way of example, a fiber system may be used for Raman shifting in the near IR with relatively high output power, and then frequency tripled to produce UV output.

Raman shifting easily occurs because of the high power density of the fiber laser required in the material processing applications of the present invention. Hence, a recognized benefit of the present invention results from a controllable shift of the input wavelength to produce an output wavelength matched to requirements for material processing. A typical undesirable shift of about 50–60 nm was previously found through experiment. It was also recognized that the spectral broadening occurs and that methods are available in the art of fiber laser design to minimize the output spectral shift by using a filter to narrow the bandwidth. Such a filter could be a bulk interference filter or a diffraction grating which in written onto the fiber using commercially available systems. The usual tradeoff for optical output power (over a broader spectrum) vs. narrowband output power which is, to a large extent, application dependent.

Laser System—Alternative

There are numerous advantages cited above of the preferred system of the seed laser and fiber amplifier. Current modulation of the laser diode with an appropriate driver can directly produce a desired gain-switched pulse shape which is amplified by the fiber laser amplifier with low distortion. The method is contemplated as the best and most efficient approach to practicing the present invention. However, those skilled in the art of laser pulse generation and shaping will recognize that other less efficient approaches can be used. For example, modifications of Q-switched systems extending beyond the teachings of 4,483,005 are possible to obtain relatively flat pulses by using various control functions to drive a pockels cell or optical switches provided that the modulator response time is fast enough. Modern techniques for effecting pulse width include the use of modified output couplers, for instance, replacing conventional glass in Nd:YAG Q-switched lasers with GaAs, in either bulk or crystal form. Q-switched pules of duration from several picoseconds to a few nanoseconds have been reported in passive Q-switching of an Nd:YAG laser with a GaAs output coupler, OPTICAL ENGINEERING, 38(11), 1785–88, November 1999.

Laser Processing Steps and Results

The metal link 25 is supported on the silicon substrate 30 by silicon dioxide insulator layer 32, which may be, e.g., 0.3–0.5 microns thick. The silicon dioxide extends over the link, and often an additional insulating layer of silicon nitride is present over the $SiO_2$ layer. In the link blowing technique, the laser beam impinges on each link and heats it to the melting point. During the heating, the metal is prevented from vaporizing by the confining effect of the overlying passivation layers. During the duration of the short pulse, the laser beam progressively heats the metal, until the metal so expands that the insulator material ruptures. At this point, the molten material is under such high pressure that it instantly vaporizes and blows cleanly out through the rupture hole.

As disclosed in the above-noted '759 patent, with the very small spot size used with small metal links, the heat may be considered to spread in essentially an exponential gradient by conduction from the portion of the beam striking the target. By employing a peak beam power so high that sufficient energy for evaporation of the link is delivered in a pulse of 8 nanoseconds, and preferably substantially less, the conductive component of heat transfer can be substantially confined to a metal link and the underlying oxide layer, despite its being very thin, such that the temperature rise in the silicon attributable to conduction and the temperature rise attributable to absorption of the beam in silicon, can cumulatively be kept below the temperature threshold at which unacceptable silicon damage occurs.

Furthermore, the above-noted '759 patent teaches several important aspects related to the thermal transfer characteristics of the link and adjacent structures. A thermal model predicts that narrow pulse widths, 3–10 ns, for example, which in turn are dependent upon the thickness of the target materials, are preferred to avoid heat conduction and subsequent damage to the Si substrate for representative dimensions. However, it is critically important to realize that other structures adjoining the link can also affect the quality of laser processing results, as the following experimental results indicate.

The benefits of the gain-switched, square pulse shape were verified with both experimental results on and through computer simulation (finite element analysis). Specifications for the laser used for link blowing were:

| Laser wavelength | 1.083 microns |
|---|---|
| Maximum Laser energy | 10 microjoules |
| Pulse width | 7 ns (FWHM, square pulse) |
| Repetition rate | 10 KHz (70 KHz laser rate) |
| Spatial profile | Gaussian, TEM-OO, $M^2$ = 1.02 (times diffraction limit) |
| Polarization | Unpolarized |
| Pulse Rise Time | ~.5 ns |

The laser of choice was a Ytterbium, cladding pumped fiber laser, in the MOPA configuration using a 980 nm pump diode and a 7 micron diameter single mode fiber.

Experimental results with the laser specified above on recent generation memory devices demonstrated superior performance when compared to the standard Q-switched laser systems. The results led to a conclusion that the short, fast rising pulse of the MOPA laser accounted for the superior performance. As disclosed earlier, the reasons are threefold:

1. The 1.083 wavelength is long enough to avoid substrate damage—about 10 times less absorption occurs at 1.083 $\mu$m compared to the 1.047 $\mu$m wavelength.
2. The fast rising pulse provides a thermal shock to the overlying layer of oxide which facilitates link removal.
3. The high power density of the fast rising pulse reduces the link reflectivity which allows for efficient energy coupling.

Figure 11A:
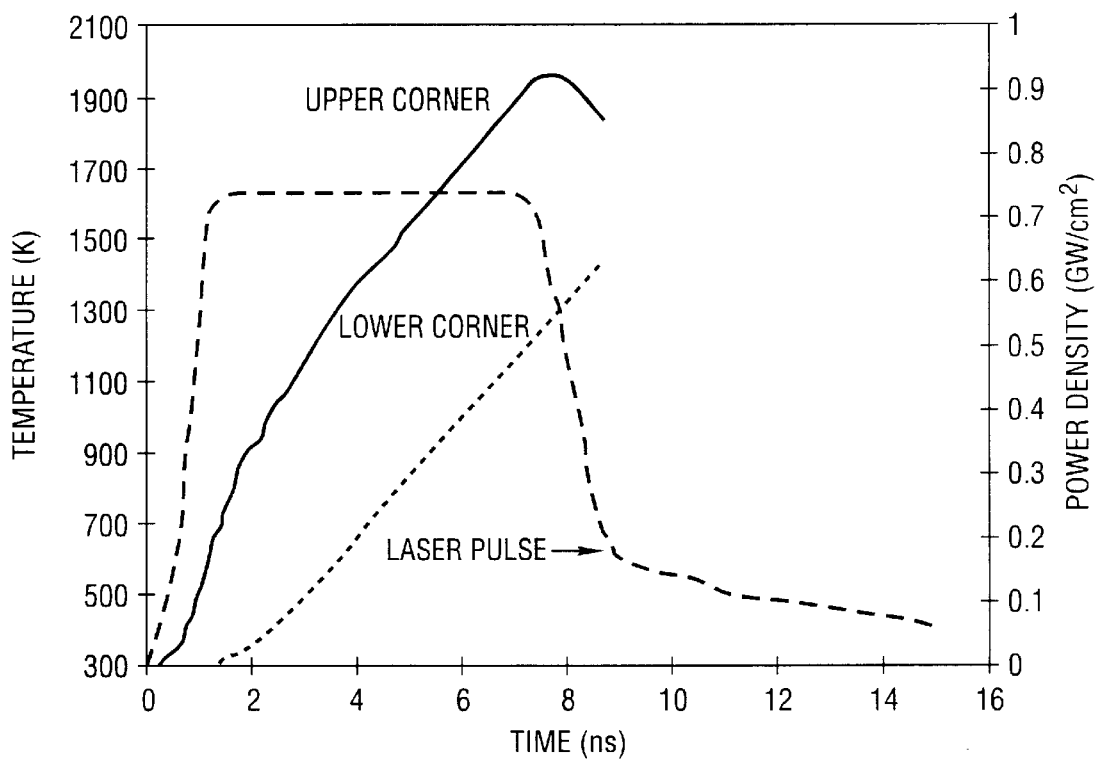
FIGS. 11a and 11b are graphs which show the results of a computer finite element analysis simulation where the time history of stress and temperature is plotted in the graphs for a Q-switched pulse and square pulse used for metal link processing.
Figure 11B:
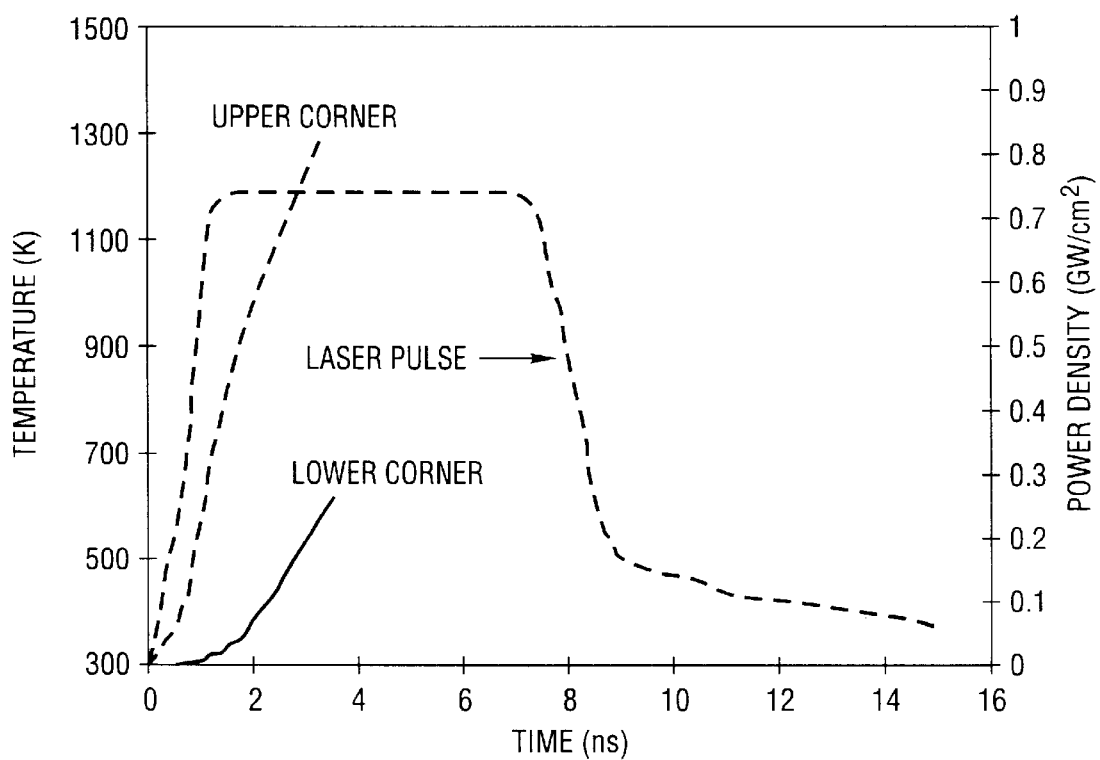

These characteristics provide a significant departure from the interaction observed with Q-switched systems. Furthermore, a computer finite element model was used to simulate the effects of the fast rising pulse for various material thickness and link sizes. The results independently confirmed the improved link blowing results with the use of a sharp rise time pulse with an approximate square distribution. The results of the computer model generated by Bernstein, author of reference number 3, are shown in FIGS. 11*a* and 11*b*. The following Tables A and B are associated with the graphs of FIGS. 11*a* and 11*b*, respectively:

TABLE A

| Model 1 @ 0.7 uJ | Square Pulse | Slow Rise Pulse |
|---|---|---|
| 1st Crack | 929K @ 1.88 ns | 978K @ 2.40 ns |
| 2nd Crack | 1180K @ 2.93 ns | 1380K @ 3.45 ns |
| 3rd Crack | 1400K @ 2.05 ns | No |
| 4th Crack | 1520K @ 4.73 ns | No |

Al thickness: 0.8 $\mu$m
Al width: 0.8 $\mu$m
$SiO_2$: 0.1 $\mu$m
$Si_3N_4$: 0.4 $\mu$m
Laser energy: 0.7 uJ

TABLE B

| Model 2 @ 0.7 uJ | Square Pulse | Slow Rise Pulse |
|---|---|---|
| 1st Crack | 974K @ 2.03 ns | 1050K @ 2.55 ns |
| 2nd Crack | No | No |
| 3rd Crack | No | No |
| 4th Crack | No | No |

Al thickness: 0.8 $\mu$m
Al width: 0.8 $\mu$m
$SiO_2$: 0.6 $\mu$m
$Si_3N_4$: 0.6 $\mu$m
Laser energy: 0.7 uJ The stress and temperature history indicate with certainty the importance of the fast rising pulse, with sub-nanosecond rise time. It is also known that if significant pulse energy is present, several nanoseconds after the ablation is completed, say at 15 ns, the Si can be damaged. A fast fall time, with a high extinction, is also important.

According to the invention, the silicon substrate is also kept relatively cool both by appropriate selection of wavelength and by limiting the pulse duration, with a correspondingly square pulse with fast decay. The laser wavelength in this example is slightly less than the room temperature absorption edge of silicon (about 1.1 $\mu$m). Although the results reported here did not indicate substrate damage, it should be noted that improved margins are available if desired. For example, the Raman shifter could be utilized to shift the output wavelength beyond the absorption edge. Alternatively, another diode laser wavelength could potentially become commercially available for a MOPA configuration. Such wavelength selection and shifting techniques may advantageously be utilized in other laser processing and micromachining applications. In any case, by thus limiting the heating, it is possible to ensure that the silicon does not shift its absorption edge into the infrared and enter a thermal runaway condition in which silicon damage can occur.

The specific embodiment of the MOPA configuration for fast pulse generation for cleanly blowing metal links is taken as an example of pulse shaping and is provided to be illustrative rather than restrictive. Through direction modulation of the seed laser, excellent sub-nanosecond control over the pulse shape was maintained, and found to be advantageous, including the possibility of fast compensation to correct the output pulse shape. Other applications in micromachining, marking, scribing, etc. could also benefit from precise, fast pulse control. For example, the seed diode could as easily be modulated with a "sawtooth" waveform or other non Q-switched waveshape for the purpose of creating or removing a specific feature on or within a surface. Likewise, because of the fast response of the laser diode, it is possible to generate a sequence of variable width, short pulses in rapid succession. Those skilled in the art of laser processing will recognize the broad application of the laser system herein. The scope of the invention is indicated by the following claims and is not to be otherwise restricted.

What is claimed is:

1. An energy-efficient, laser-based method for processing target material having a specified dimension in a microscopic region without causing undesirable changes in electrical or physical characteristics of material surrounding the target material, the method comprising:

generating a laser pulse train utilizing a laser having a first wavelength at a repetition rate wherein each of the pulses of the pulse train has a predetermined shape;

optically amplifying the pulse train without significantly changing the predetermined shape of the pulses to obtain an amplified pulse train wherein each of the amplified pulses has a substantially square temporal power density distribution, a sharp rise time, a pulse duration and a fall time;

controllably shifting the first wavelength to a second wavelength different from the first wavelength to obtain an amplified, wavelength-shifted, pulse train; and delivering and focusing at least a portion of the amplified, wavelength-shifted, pulse train into a spot on the target material wherein the rise time is fast enough to efficiently couple laser energy to the target material, the pulse duration is sufficient to process the target material, the fall time is rapid enough to prevent the undesirable changes to the material surrounding the target material and the second wavelength more efficiently couples laser energy to the target material than the first wavelength.

2. The method as claimed in claim 1 wherein the target material includes microstructures.

3. The method as claimed in claim 2 wherein the microstructures are conductive lines.

4. The method as claimed in claim 3 wherein the conductive lines are metal lines and wherein the pulse duration is sufficient to effectively heat and vaporize a specified portion of the metal lines.

5. The method as claimed in claim 1 wherein the target material is a part of a semiconductor device.

6. The method as claimed in claim 5 wherein the semiconductor device is a silicon semiconductor device and wherein the second wavelength is at an absorption edge of silicon.

7. The method as claimed in claim 5 wherein the semiconductor is a semiconductor memory.

8. The method as claimed in claim 7 wherein the memory has a density of at least 16 and up to 256 megabits.

9. The method as claimed in claim 1 wherein at least a portion of the material surrounding the target material is a substrate.

10. The method as claimed in claim 9 wherein the substrate is a semiconductor substrate.

11. The method as claimed in claim 1 wherein the target material is part of a microelectronic device.

12. The method as claimed in claim 5 wherein the semiconductor is a microelectromechanical device.

13. The method as claimed in claim 1 wherein the substantially square temporal power density distribution is sufficient to substantially completely ablate the target material.

14. The method as claimed in claim 1 wherein the rise time is less than 1 nanosecond.

15. The method as claimed in claim 14 wherein the rise time is less than 0.5 nanoseconds.

16. The method as claimed in claim 1 wherein the pulse duration is less than 10 nanoseconds.

17. The method as claimed in claim 16 wherein the pulse duration is less than 5 nanoseconds.

18. The method as claimed in claim 1 wherein the fall time is less than 2 nanoseconds.

19. The method as claimed in claim 1 wherein a single amplified pulse is sufficient to process the target material.

20. The method as claimed in claim 1 wherein the target material has a reflectivity to the amplified pulses and wherein the power density of the amplified pulses is sufficiently high to reduce the reflectivity of the target material to the amplified pulses and to provide efficient coupling of the laser energy to the target material.

21. The method as claimed in claim 1 wherein each amplified pulse has a relatively uniform power density distribution throughout the pulse duration.

22. The method as claimed in claim 1 wherein each pulse has a temporal power density distribution uniform to within ten percent during the pulse duration.

23. The method as claimed in claim 1 wherein the material surrounding the target material has optical properties and thermal diffusivity properties different from the corresponding properties of the target material.

24. The method as claimed in claim 23 wherein the optical properties include absorption.

25. The method as claimed in claim 23 wherein the optical properties include polarization sensitivity.

26. The method as claimed in claim 1 wherein the repetition rate is at least 1000 pulses/second.

27. The method as claimed in claim 1 wherein each of the amplified pulses has at least 0.1 and up to 3 microjoules of energy.

28. The method as claimed in claim 1 wherein the step of optically amplifying provides a gain of at least 20 DB.

29. The method as claimed in claim 1 wherein both the rise time and the fall time are less than one-half of the pulse duration and wherein peak power of each amplified pulse is substantially constant between the rise and fall times.

30. The method as claimed in claim 1 wherein each of the amplified pulses has a tail and further comprising attenuating laser energy in the tails of the amplified pulses to reduce fall time of the amplified pulses while substantially maintaining the amount of power of the pulses.

31. The method as claimed in claim 30 wherein the attenuated laser energy in the tails is attenuated by at least 20 dB within 1.5 times the pulse duration.

32. The method as claimed in claim 1 wherein the pulse duration is a function of the specified dimension.

33. The method as claimed in claim 1 wherein the specified dimension is less than the laser wavelength.

34. The method as claimed in claim 1 wherein the laser is a high speed, semiconductor laser diode.

35. The method as claimed in claim 34 wherein the first wavelength less than about 1.1 $\mu$m and the second wavelength is about 1.1 $\mu$m.

36. The method as claimed in claim 1 wherein the spot has a dimension in the range of about 1 $\mu$m–4 $\mu$m.

37. The method as claimed in claim 34 wherein the laser diode is a multimode diode laser.

38. The method as claimed in claim 34 wherein the laser diode is a single frequency laser diode utilizing a distributed Bragg reflector (DBR), distributed feedback (DFB), or an external cavity design.

39. An energy-efficient system for processing target material having a specified dimension in a microscopic region without causing undesirable changes in electrical or physical characteristics of material surrounding the target material, the system comprising:

a controller for generating a processing control signal;

a signal generator for generating a modulated drive waveform based on the processing control signal, wherein the waveform has a sub-nanosecond rise time;

a gain-switched, pulsed seed laser having a first wavelength for generating a laser pulse train at a repetition rate, the drive waveform pumping the laser so that each pulse of the pulse train has a predetermined shape;

a fiber amplifier subsystem for optically amplifying the pulse train without significantly changing the predetermined shape of the pulses, the subsystem including a wavelength shifter for controllably shifting the first wavelength to a second wavelength different from the first wavelength to obtain an amplified, wavelength-shifted, pulse train wherein each of the amplified pulses has a substantially square temporal power density distribution, a sharp rise time, a pulse duration and a fall time; and a beam delivery and focusing subsystem for delivering and focusing at least a portion of the amplified, wavelength-shifted, pulse train into a spot on the target material wherein the rise time is fast enough to efficiently couple laser energy to the target material, the pulse duration is sufficient to process the target material, the fall time is rapid enough to prevent the undesirable changes to the material surrounding the target material and the second wavelength more efficiently couples laser energy to the target material than the first wavelength.

40. The system as claimed in claim 39 wherein the fiber amplifier subsystem includes a filter coupled to the shifter to narrow bandwidth of the amplified, wavelength-shifted, pulse train.

41. The system as claimed in claim 39 wherein the target material includes microstructures.

42. The system as claimed in claim 41 wherein the microstructures are conductive lines.

43. The system as claimed in claim 42 wherein the conductive lines are metal lines and wherein the pulse duration is sufficient to effectively heat and vaporize a specified portion of the metal lines.

44. The system as claimed in claim 39 wherein the target material is a part of a semiconductor device.

45. The system as claimed in claim 44 wherein the semiconductor is a silicon semiconductor device and wherein the second wavelength is at an absorption edge of silicon.

46. The system as claimed in claim 44 wherein the semiconductor is a semiconductor memory.

47. The system as claimed in claim 46 wherein the memory has a density of at least 16 and up to 256 megabits.

48. The system as claimed in claim 39 wherein at least a portion of the material surrounding the target material is a substrate.

49. The system as claimed in claim 48 wherein the substrate is a semiconductor substrate.

50. The system as claimed in claim 44 wherein the semiconductor is a microelectromechanical device.

51. The system as claimed in claim 39 wherein the target material is part of a microelectronic device.

52. The system as claimed in claim 39 wherein the substantially square temporal power density distribution is sufficient to substantially completely ablate the target material.

53. The system as claimed in claim 39 wherein the rise time is less than 1 nanosecond.

54. The system as claimed in claim 53 wherein the rise time is less than 0.5 nanoseconds.

55. The system as claimed in claim 39 wherein the pulse duration is less than 10 nanoseconds.

56. The system as claimed in claim 55 wherein the pulse duration is less than 5 nanoseconds.

57. The system as claimed in claim 39 wherein the fall time is less than 2 nanoseconds.

58. The system as claimed in claim 39 wherein a single amplified pulse is sufficient to process the target material.

59. The system as claimed in claim 39 wherein the target material has a reflectivity to the amplified pulses and wherein the power density of the amplified pulses is sufficiently high to reduce the reflectivity of the target material to the amplified pulses and to provide efficient coupling of the laser energy to the target material.

60. The system as claimed in claim 39 wherein each amplified pulse has a relatively uniform power density distribution throughout the pulse duration.

61. The system as claimed in claim 39 wherein the material surrounding the target material has optical properties and thermal diffusivity properties different from the corresponding properties of the target material.

62. The system as claimed in claim 61 wherein the optical properties include absorption.

63. The system as claimed in claim 61 wherein the optical properties include polarization sensitivity.

64. The system as claimed in claim 39 wherein the repetition rate is at least 1000 pulses/second.

65. The system as claimed in claim 39 wherein each of the amplified pulses has at least 0.1 and up to 3 microjoules of energy.

66. The system as claimed in claim 39 wherein the step of optically amplifying provides a gain of at least 20 DB.

67. The system as claimed in claim 39 wherein both the rise time and the fall time are less than one-half of the pulse duration and wherein peak power of each amplified pulse is substantially constant between the rise and fall times.

68. The system as claimed in claim 39 wherein the fiber amplifier subsystem includes an optical fiber and a pump to pump the optical fiber wherein the pump is distinct from the seed laser.

69. The system as claimed in claim 68 wherein the wavelength shifter is the optical fiber.

70. The system as claimed in claim 69 wherein the pump pumps the optical fiber at a third wavelength and wherein a wavelength difference between the first and third wavelength corresponds to a vibrational transition of the optical fiber.

71. The system as claimed in claim 68 wherein the pump is a high power laser diode.

72. The system as claimed in claim 39 wherein the seed laser includes a laser diode.

73. The system as claimed in claim 39 wherein each pulse has a temporal power density distribution uniform to within ten percent during the pulse duration.

74. The system as claimed in claim 39 wherein each of the amplified pules has a tail and further comprising an attenuator for attenuating laser energy in the tails of the amplified pulses to reduce fall time of the amplified pulses while substantially maintaining the amount of power of the pulses.

75. The system as claimed in claim 74 wherein the attenuator attenuates laser energy in the tails by at least 10 dB within 1.5 times the pulse duration.

76. The system as claimed in claim 39 wherein the pulse duration is a function of the specified dimension.

77. The system as claimed in claim 39 wherein the specified dimension is less than the wavelength.

78. The system as claimed in claim 72 wherein the first wavelength is less than about 1.1 $\mu$m and the second wavelength is about 1.1 $\mu$m.

79. The system as claimed in claim 39 wherein the spot has a dimension in the range of about 1 $\mu$m–4 $\mu$m.

80. The system as claimed in claim 72 wherein the laser diode is a multimode diode laser.

81. The system as claimed in claim 72 wherein the laser diode is a single frequency laser diode utilizing a distributed Bragg reflector (DBR), distributed feedback (DFB), or an external cavity design.

82. The system as claimed in claim 72 wherein the pump is a gain-switched laser diode.

83. The system as claimed in claim 39 further comprising an optical switch and a computer coupled to the optical switch and the subsystem for selecting material processing pulses of the pulse train and to control position of the selected pulses relative to the target material.

84. The system as claimed in claim 68 wherein the optical fiber is a single mode optical fiber and the pump is a pump diode.

* * * * *